United States Patent [19]

Bastida et al.

[11] Patent Number: 4,511,860

[45] Date of Patent: Apr. 16, 1985

[54] PLANAR MICROWAVE OSCILLATOR MOUNTED ON A DIELECTRIC CAVITY

[75] Inventors: Ezio M. Bastida, Segrate; Paolo Bergamini, Milan, both of Italy

[73] Assignee: CISE Centro Informazioni Studi Esperienze S.p.A., Milan, Italy

[21] Appl. No.: 395,983

[22] Filed: Jul. 7, 1982

[30] Foreign Application Priority Data

Jul. 8, 1981 [IT] Italy .............................. 22817 A/81

[51] Int. Cl.³ .......................... H03B 5/18; H01P 3/08
[52] U.S. Cl. ...................................... 331/96; 331/99;
    331/107 SL; 331/117 D; 333/238; 333/247
[58] Field of Search .................... 331/96, 99, 107 SL,
    331/117 D; 333/238, 246, 247

[56] References Cited

U.S. PATENT DOCUMENTS 4,211,987 7/1980 Pan ................................. 333/246 X

FOREIGN PATENT DOCUMENTS 84446 7/1978 Japan ..................................... 331/96
127705 10/1980 Japan ............................. 331/117 D

OTHER PUBLICATIONS

Bastida; E. M., et al. "GaAs Monolithic Circuits Mounted Over High Q Dielectric Resonators", *IEEE Microwave and Millimeter-Wave Monolithic Circuits Symposium* (Dallas, Texas, USA), Digest Papers, pp. 11-15, May 1982.

Pucel; R. A., "Design Considerations for Monolithic Microwave Circuits", *IEEE Transactions on Microwave Theory and Techniques*, vol. MTT-29, No. 6, Jun. '81, pp. 513-520.

*Primary Examiner*—Eugene R. LaRoche
*Assistant Examiner*—D. C. Mis
*Attorney, Agent, or Firm*—Cushman, Darby & Cushman

[57] ABSTRACT

A planar oscillator (9, 109) having a dielectric cavity (25, 125) and which is operative at microwave frequencies, said oscillator consisting of a dielectric material base (10, 110) one surface of which has, superposed thereto, a continuous layer (11,111) of a conductive material which coats portions of said face; the remaining portions (10A, 10B, 110A', 110A", 110B) of the surface have, superposed thereto, strips of a conductive material (12,13,14,112,113,114) which are separate from each other and are electrically connected to an active element (19, 119), a dielectric cavity (25,125) adhering to the opposite surface of the dielectric material base (10,110), the layer of conductive material (11,111) providing a grounding plane and the strips of conductive material (12,13,14,112,113,114) providing transmission and output lines for the oscillator.

6 Claims, 4 Drawing Figures

PLANAR MICROWAVE OSCILLATOR MOUNTED ON A DIELECTRIC CAVITY

The present invention relates to a planar oscillator having a dielectric cavity, which operates at microwave frequencies.

Planar oscillators of the microstrip type are known at present in this field. They essentially comprise a conductive layer, which provides a grounding plane, which has, superposed thereon, an insulating or dielectric layer which is usually composed of alumina or, whenever it is desired to produce them in a monolithic form, of gallium arsenide.

The dielectric layer has, superposedly applied thereto, strips of a conductive material which are connected to an active circuitry element (for example a Field Effect Transistor (F.E.T.) which is appropriately biassed). Such active component is mounted on the dielectric layer and, on the latter, also a dielectric cavity, or resonator, is installed.

A few of such strips are transmission lines, which, together with said active circuitry component, the resonator and the grounding plane, compose the microwave-frequency oscillating circuitry, whereas the other strips and the grounding plane provide output lines for the planar oscillator so made up.

The microstrip type planar oscillator referred to above suffers from a number of shortcomings.

The connection of a point of the transmission lines with the grounding plane (for example for modifying parameters of the circuit, such as the output power or the oscillation frequency or otherwise) is obtained by piercing the dielectric layer so as to have the connection line passed therethrough. If an alumina dielectric layer is adopted, the brittleness of such material is such as to originate a disruption during drilling so that the oscillator may be irremediably impaired, the result being a drastic reduction of the production efficiency and of the reliability of the oscillators concerned. The situation is still worse if a dielectric layer of gallium arsenide is used; as a matter of fact, such material is used in very thin layers so as to be able to etch it through so that it is virtually impossible to drill it without disruption due to its brittleness, so that, also in such a case, the production efficiency and the reliability of the oscillators so produced is drastically reduced.

Moreover, inasmuch as the microstrip-type planar oscillators referred to above are bound to stringent dimensional specifications since the thickness of the dielectric layer must be directly proportional to the width of the transmission line, it is apparent that, whenever a gallium arsenide dielectric layer is adopted which is extremely thin as outlined just now, such transmission lines are, of necessity, very thin and this fact, as is known, makes the losses in the transmission lines greater so that the performances of the oscillator as to stability and power level are drastically curtailed.

Lastly, the resonator must be positioned on the dielectric layer on the same side as the active circuit component and both alongside it and alongside the transmission and output lines and this requirement entails an oversizing of the surface of the dielectric layer because the resonator, very often, has dimensions which exceed those of every individual circuit component of the oscillator. An ideal approach would be to arrange the resonator on the side away of the active component and by thus placing the resonator beneath the grounding plane so as to optimize the spatial distribution of the components of the oscillator. Such an arrangement of the resonator cannot be adopted in the microstrip-type planar oscillators in question because the grounding plane would behave like a shield between the active component and the resonator and the oscillations at microwave frequencies could not take place.

An objective of the present invention is to solve the problems of the prior and contemporary art referred to above.

This objective is attained by providing a dielectric-cavity planar oscillator which operates at microwave frequencies, which is characterized in that it consists of a base of a dielectric material having, superposed to either face thereof, a continuous layer of a conductive material which coats portions of said face, the remaining portions of said face having, superposedly applied thereto, strips of a conductive material which are separate from each other and are electrically connected to an active circuit component, the opposite face of said dielectric material base having, adhered thereto, a dielectric cavity, said layer of conductive material being a grounding plane and said strips of conductive material being transmission and output lines for the oscillator concerned.

The features and the advantages of the present invention will become more clearly apparent from the ensuing description of two exemplary embodiments thereof which are nonlimiting and are illustrated in the accompanying drawings, wherein.

Figure 1:
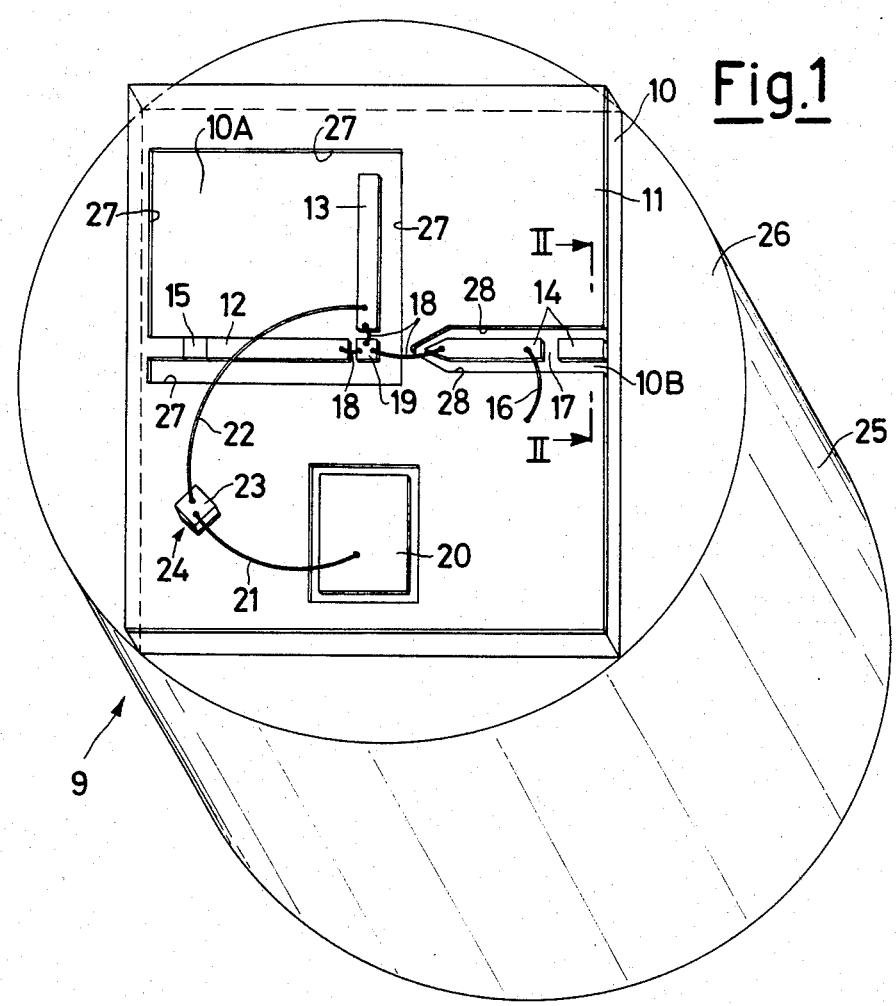
FIG. 1 is a perspective view of a first oscillator made according to this invention.

The planar oscillator shown in FIG. 1, generally indicated at 9, comprises a base layer 10 of a dielectric material, for example gallium arsenide, either face of which has, superposedly applied thereto, a continuous layer 11, of a conductive material, for example gold, which coats portions of the dielectric layer 10. The remaining portions of the dielectric layer 10 have three strips 12, 13 and 14 of conductive material running thereon, for example gold strips, which are separated from each other and are superposed to said remaining portions. The conductive strip 12 is connected to the conductive layer 11 by a portion 15 of a resistive material, such as titanium oxide; the conductive strip 14 is connected to the conductive layer 11 by a conductive wire 16 having a length equal to one quarter wavelength and is interrupted for a portion 17.

The conductive strips 12, 13 and 14 are electrically connected at either end by wires 18 of a conductive material, to an active component 19 which can be, for example, a properly biased field effect transistor.

For biasing the active component 19, a portion 20 of the conductive layer 11, insulated from the remaining portion of the layyer 11 and electrically connected to a pole of an electric cell (not shown), is electrically connected to the strip 13 by two conductive wires 21 and 22 which are bridged together by either armature of a capacitor 24: the opposite armature of the capacitor 24, which cannot be seen in the drawing, is electrically connected to said remaining portion of the layer 11.

Beneath the dielectric layer 10 a dielectric cavity or resonator 25 is arranged having a cylindrical shape and composed of barium and titanium oxide ($Ba_2Ti_9O_{20}$). In practice, the bottom face of the dielectric layer 10, opposite to the face which supports what has been described heretofore, is united in contacting relationship with the top base 26 of the dielectric cavity 25. The layer 11, with the exception of the portion 20, is the grounding plane and is connected to the other pole of the electric cell; the strips 12 and 13 are the transmission lines and the strip 14 is the output line of the planar oscillator so constructed.

The active component, the transmission lines, the resonator and the grounding plane form, as is known, an oscillating circuit which generates a microwave-frequency signal to be drawn from the output line for subsequent use.

The capacitor 23 short-circuits the microwave-frequency signal in such a way that said signal cannot emerge through the input. The resistive portion 15 prevents the reflection of the microwave-frequency signal coming from the line 12 and this enables purer output signals to be obtained. The wire 16 closes to the ground the feeding circuit of the oscillator. The portion 17 unmatches the output relative to D.C. while it gives a free way to the microwave-frequencies.

The distribution and arrangement of the layer 11 and the strips 12, 13 and 14 preferably follows a particular geometrical pattern to be described hereafter and shown in the drawings.

The layer 11, as outlined above, does not mask the base layer 10 completely, but leaves free, out of said layer, a portion 10A having a square outline and an adjoining portion 10B having a rectangular outline, which is closed, towards the portion 10A, so as to form a pointed end.

The strips 12 and 13, having a rectangular form, run along the portion 10A and are arranged consecutively and perpendicular with respect to one another and are parallel to the edge 27 of the layer 11 which confines the portion 10A. Also the strip 14, having a rectangular shape and closed towards the portion 10A in the form of a peak, runs along the respective portion 10B parallely of the edge 28 of the layer 11 which confined the portion 10B.

For each strip, the ratio of the width of the space existing between the strip and the respective nearest parallel edge of the layer 11 to the width of the strip itself must be a constant and never exceed three. This condition is met in the planar oscillator shown herein.

The layer 11, the portion 20, the strips 12, 13 and 14 can be obtained by depositing on the whole preselected face of the dielectric layer 10 a metallic layer, which is subsequently removed by photo-etching in the appropriate zones in order that the configuration illustrated herein may be obtained.

The planar oscillator described herein gives remarkable performances inasmuch as its output signal has a very pure spectrum and a very high frequency stability over a wide temperature range.

The geometrical ratios indicated above encourage the achievement of performances of a high quality. In addition, all the shortcomings enumerated in the introductory part of this specification are eliminated, as compared with the conventional microstrip planar oscillators.

Figure 2:
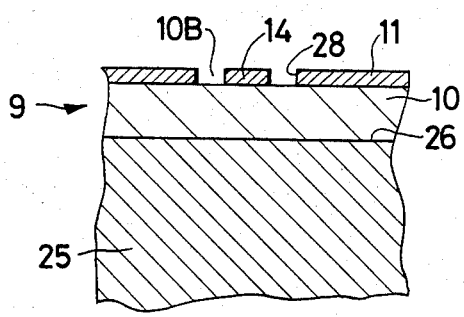
FIG. 2 is a cross-sectional view, taken along the line II—II of the oscillator shown in FIG. 1.
Figure 3:
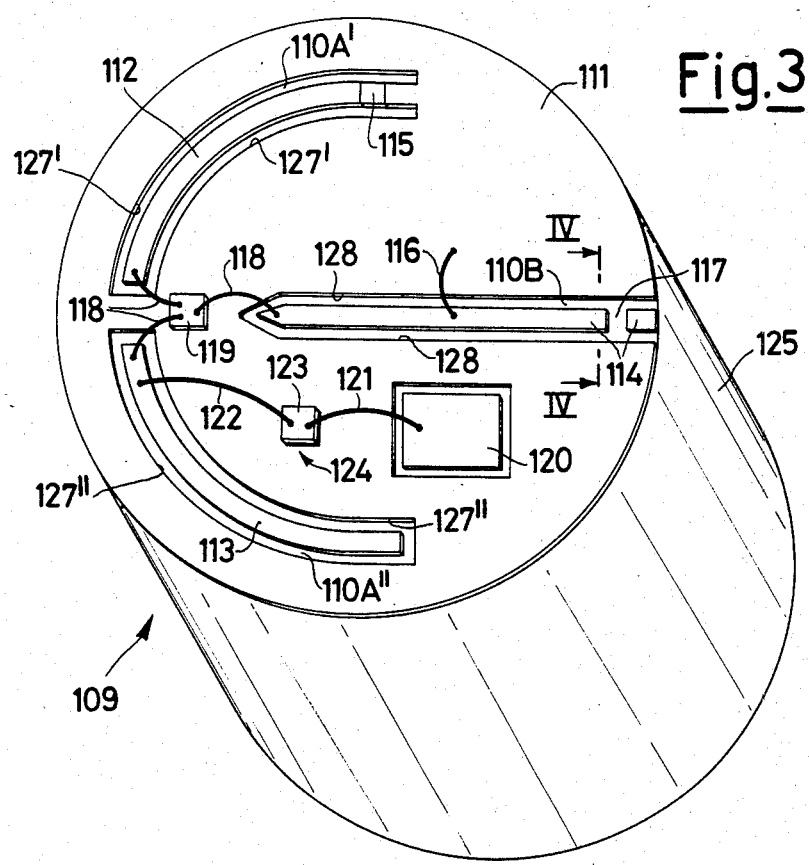
FIG. 3 is a perspective view of a second oscillator made according to the invention.
Figure 4:
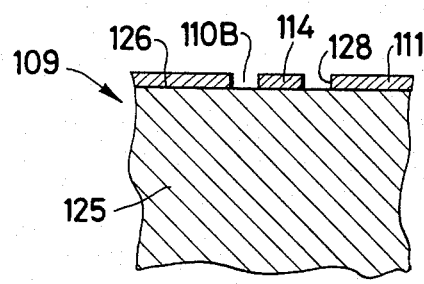
FIG. 4 is a cross-sectional view, taken along the line IV—IV of the oscillator shown in FIG. 3.

FIG. 2 shows an alternative embodiment of the oscillator according to the invention, by way of example.

In the drawing, there have been adopted, for like component parts, the same reference numbers as for the oscillator of FIG. 1, but increased by 100.

The oscillator 109 of FIG. 2 differs from the oscillator shown in FIG. 1 substantially, in that the layer 111 and the strips 112, 113 and 114 of a conductive material are directly superposed to the base 126 of the dielectric cavity 125, whereas, in the oscillator 9 of FIG. 1 they rested on a layer 10 of a dielectric material, which, in its turn, was superposed to the relevant base 26 of the dielectric cavity 25. In practice, in the oscillator 109, the base 126 fulfils the same functions as the layer 10 of the oscillator 9. By so doing, that is to say by directly superposing to a superficial portion of the dielectric cavity both the layer and the strips of a conductive material, the manufacturing process of an oscillator according to the invention is simplified to a degree.

The differences involve also the strips 112 and 113: as a matter of fact, they have the outline of an arc of a circle and run along two discrete portions having the same arcuate outline, that is the strip 112 runs along a portion 110A' having an edge 127' and the strip 113 runs along a portion 110A" having an edge 127" and finally, the strips are arranged sequentially along a half-circle. The strip 114 is positioned between the strips 112 and 113 along a diametrical direction and symmetrically with respect to the latter strips.

Also in the oscillator 109, the ratio of the width of the space existing between the strip and the respective parallel edge of the layer 111 to the strip width is respected, the width of the space aforementioned being constant for all the strips of the oscillator 109.

It is recalled herein that the ratio in question is a constant and should never exceed three.

The considerations as to the operation and the outstanding performances of the oscillator 109 are very much the same as those made for the oscillator 9 hereinbefore.

It is apparent that the exemplary embodiments shown herein do not pose any limitations to possible modifications and/or integrations.

More particularly, the arrangements and the geometrical configurations of the layers 11 and 111 and of the strips 12, 13, 14 and 112, 113, 114, as shown in FIGS. 1 and 2, respectively, permit that outstanding performances may be obtained, as has been ascertained by field tests, but this does not exclude that other arrangements and geometrical configurations may be adopted, provided that the mutual coplanar relationship of the layer 11 with the strips 12, 13, 14, or of the layer 111 with the strips 112, 113, 114, be always provided.

We claim:

1. A planar oscillator having a dielectric cavity, operable at microwave frequencies, characterized in that it consists of a base of a dielectric material (10, 110) to a face of which there is superposed a continuous layer (11, 111) of a conductive material coating portions of said face, to remaining portions (10A, 10B, 110A', 110A", 110B) of said face there being superposed strips (12, 13, 14, 112, 113, 114) of a conductive material separate from each other and electrically connected (18, 118) to an active component (19, 119), to the opposite face of said dielectric material base (10, 110) a dielectric cavity (25, 125) being adherent, said layer (11, 111) of conductive material acting as a grounding plane and at least a portion of each of said strips of conductive material forming at least one waveguide and (12, 13, 14, 112, 113, 114) acting as transmission lines (12, 13, 112, 113)

and an output line (14, 114) of the oscillator (9, 109), the ratio of the width of the space existing between a side of said portion of each of said strips and the nearest adjoining edge of said conductive material layer to the width of the strip itself at each and every point being constant.

2. Planar oscillator according to claim 1, characterized in that said strips and said remaining portions comprise, respectively, a first (12, 112) and a second (13, 113) rectangular strip arranged consecutively and perpendicular with respect to one another in a first of said remaining portions (10A, 110A'), and a third strip (14, 114) arranged perpendicular with respect to one of said first and second strips in a second of said remaining portions (10B, 110B) separated from the first, said first and said second strips (12, 112, 13, 113) being transmission lines and said third strip (14, 114) acting as an output line of said oscillator (9, 109).

3. Planar oscillator according to claim 1, characterized in that said strips and said remaining portions comprise, respectively, a first and a second strip (112, 113) arranged in sequential order in the form of a half-circle, said first strip (112) in a first of said remaining portions (110A') and said second strip (113) in a second (110A'') of said remaining portions separated from the first portion, and a third rectangular strip (114) arranged diametrically and symmetrically between said first (112) and said second (113) strips in a third portion (110B) separated from the first two of said remaining portions, said first and said second strips (112, 113) being transmission lines and said third strip (114) being an output line of said oscillator (109).

4. Planar oscillator according to claim 1, characterized in that said base is composed of a layer of a dielectric material superposed to said dielectric cavity.

5. Planar oscillator according to claim 1, characterized in that said base is directly composed of a superficial portion of said dielectric cavity.

6. Planar oscillator according to claim 1, characterized in that, for each of said strips, the ratio of the width of the space existing between the strip and the nearest adjoining edge of said conductive material layer confining the relevant remaining portion, to the width of the strip itself, does not exceed three.

* * * * *